United States Patent
Cheah et al.

(10) Patent No.: US 10,943,792 B2
(45) Date of Patent: Mar. 9, 2021

(54) 3D STACKED-IN-RECESS SYSTEM IN PACKAGE

(71) Applicants: Intel Corporation, Santa Clara, CA (US); Bok Eng Cheah, Bukit Gambir (MY); Min Suet Lim, Simpang Ampat (MY); Jackson Chung Peng Kong, Tanjung Tokong (MY); Howe Yin Loo, Sungai Petani (MY)

(72) Inventors: Bok Eng Cheah, Bukit Gambir (MY); Min Suet Lim, Simpang Ampat (MY); Jackson Chung Peng Kong, Tanjung Tokong (MY); Howe Yin Loo, Sungai Petani (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/325,665

(22) PCT Filed: Sep. 27, 2016

(86) PCT No.: PCT/US2016/053925
§ 371 (c)(1),
(2) Date: Feb. 14, 2019

(87) PCT Pub. No.: WO2018/063154
PCT Pub. Date: Apr. 5, 2018

(65) Prior Publication Data
US 2019/0206698 A1    Jul. 4, 2019

(51) Int. Cl.
*H01L 25/00* (2006.01)
*H01L 21/48* (2006.01)
(Continued)

(52) U.S. Cl.
CPC .............. *H01L 21/48* (2013.01); *H01L 23/00* (2013.01); *H01L 23/48* (2013.01); *H01L 23/538* (2013.01);
(Continued)

(58) Field of Classification Search
CPC ....... H01L 23/00; H01L 23/48; H01L 23/538; H01L 23/552; H01L 23/13; H01L 23/142;
(Continued)

(56) References Cited

U.S. PATENT DOCUMENTS

2007/0040254 A1    2/2007 Lopez
2010/0136750 A1    6/2010 Lim
(Continued)

FOREIGN PATENT DOCUMENTS

WO    WO-2018063154 A1    4/2018

OTHER PUBLICATIONS

"International Application Serial No. PCT/US2016/053935, International Search Report dated Jun. 7, 2017", 4 pgs.
(Continued)

*Primary Examiner* — Chuong A Luu
(74) *Attorney, Agent, or Firm* — Schwegman Lundberg & Woessner, P.A.

(57) ABSTRACT

A system in package device includes a landed first die disposed on a package substrate. The landed first die includes a notch that is contoured and that opens the backside surface of the die to a ledge. A stacked die is mounted at the ledge and the two dice are each contacted by a through-silicon via (TSV). The system in package device also includes a landed subsequent die on the package substrate and a contoured notch in the landed subsequent die and the notch in the first die form a composite contoured recess into which the stacked die is seated.

18 Claims, 10 Drawing Sheets

(51) Int. Cl.
*H01L 23/48* (2006.01)
*H01L 23/538* (2006.01)
*H01L 23/552* (2006.01)
*H01L 25/065* (2006.01)
*H01L 29/06* (2006.01)
*H01L 23/00* (2006.01)
*H01L 25/18* (2006.01)

(52) U.S. Cl.
CPC ........ *H01L 23/552* (2013.01); *H01L 25/0652* (2013.01); *H01L 25/0655* (2013.01); *H01L 25/18* (2013.01); *H01L 25/50* (2013.01); *H01L 29/0657* (2013.01); *H01L 2224/13025* (2013.01); *H01L 2224/16146* (2013.01); *H01L 2224/16225* (2013.01); *H01L 2224/16235* (2013.01); *H01L 2224/17181* (2013.01); *H01L 2225/06513* (2013.01); *H01L 2225/06517* (2013.01); *H01L 2225/06541* (2013.01); *H01L 2924/1432* (2013.01); *H01L 2924/1434* (2013.01); *H01L 2924/15192* (2013.01); *H01L 2924/15311* (2013.01); *H01L 2924/3025* (2013.01)

(58) Field of Classification Search
CPC ... H01L 23/5389; H01L 25/00; H01L 25/065; H01L 25/0652; H01L 25/50; H01L 25/0655; H01L 25/074; H01L 25/0657; H01L 25/0756; H01L 25/117; H01L 21/4825; H01L 21/4853; H01L 21/48; H01L 24/00; H01L 24/34; H01L 24/35; H01L 24/20; H01L 24/95; H01L 24/19; H01L 24/29; H01L 24/73; H01L 24/92; H01L 24/83; H01L 24/97; H01L 2225/06596; H01L 2225/0652; H01L 2224/18; H01L 2224/83192; H01L 2224/83203; H01L 2224/73267; H01L 2224/922244; H01L 2224/32245; H01L 2224/15153; H01L 2924/1432; H01L 2924/15153; H01L 2924/1434; H01L 2924/15192; H01L 2924/15311; H01L 2924/3025
USPC .................................................. 257/676, 686
See application file for complete search history.

(56) References Cited

U.S. PATENT DOCUMENTS

| | | | |
|---|---|---|---|
| 2010/0320601 A1* | 12/2010 | Pagaila | H01L 21/76898 257/738 |
| 2013/0154117 A1 | 6/2013 | Tan et al. | |
| 2013/0277865 A1 | 10/2013 | Teh et al. | |
| 2013/0292850 A1 | 11/2013 | Chua et al. | |
| 2015/0145116 A1* | 5/2015 | Uzoh | H01L 24/10 257/712 |

OTHER PUBLICATIONS

"International Application Serial No. PCT/US2016/053935, Written Opinion dated Jun. 7, 2017", 8 pgs.
"International Application Serial No. PCT US2016 053935, International Preliminary Report on Patentability dated Apr. 11, 2019", 10 pgs.

* cited by examiner

US 10,943,792 B2

3D STACKED-IN-RECESS SYSTEM IN PACKAGE

CLAIM OF PRIORITY

This patent application is a U.S. National Stage Application under 35 U.S.C. 371 from International Application No. PCT/US2016/053935, filed Sep. 27, 2016, published as WO2018/063154, which is incorporated herein by reference.

FIELD

The present description relates to microelectronic die packaging and, in particular, to low-profile 3D stacked architecture system-in package devices with stacked dice mounted at a notch of a landed die.

BACKGROUND

System in package devices are under miniaturization pressure to improve connectivity and to make the packaged device amenable to current manufacturing trends and commercial implementations.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
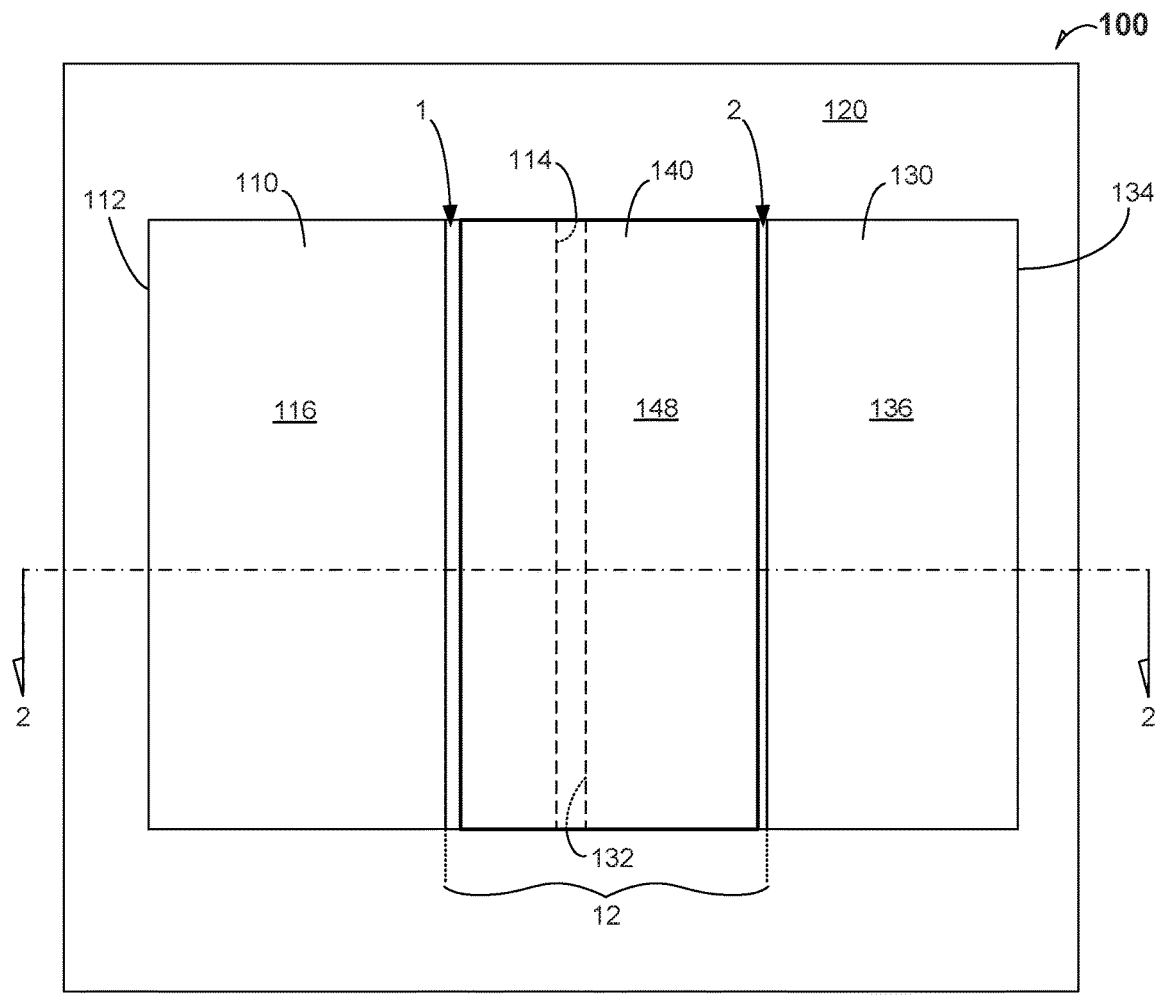
FIG. 1 is top plan of a system in package device with a landed first die, a landed subsequent die, and a stacked first die according to an embodiment.

FIG. 1 is top plan of a system in package (SiP) device 100 with a landed first die 110, a landed subsequent die 130, and a stacked first die 140 that is mounted in a composite recess 12 according to an embodiment. As will be further set forth in this disclosure, a composite recess may be referred to simply as a cavity although the cavity is formed effectively by at least one notched die.

The landed first die 110 and the landed subsequent die 130 are disposed on a mounting substrate 120 and the stacked first die 140 is disposed in the composite recess 12 formed by respective notches 1 and 2 on the landed first- and subsequent dice 110 and 130.

In an embodiment, the package substrate 120 is land-side bumped with land-side bumps 102 in an array on land-side bond pads 104. In an embodiment, the package substrate 120 is configured without any land-side bumps and the package substrate 120 is usefully insulated such that it serves as an outer shell for a computing device such as any suitable computing device described for FIG. 12.

The landed first die 110 includes a first die backside surface 116, an x-lateral first edge 112 and an x-lateral second edge 114. The term "x-lateral" refers to an edge encountered when scanning along the x-axis. The landed subsequent die 130 includes a subsequent die backside surface 136, an x-lateral first edge 132 and an x-lateral second edge 134.

In an embodiment, the landed first die 110 is a central processing unit (CPU) such as a processor made by Intel Corporation of Santa Clara, Calif. In an embodiment, the landed subsequent die 130 is a memory die such as a non-volatile memory. In an embodiment, the stacked first die 140 is a silicon bridge that connects the landed first die 110 to the landed subsequent die 130. The stacked first die 140 includes a stacked first die backside surface 148.

Figure 2:
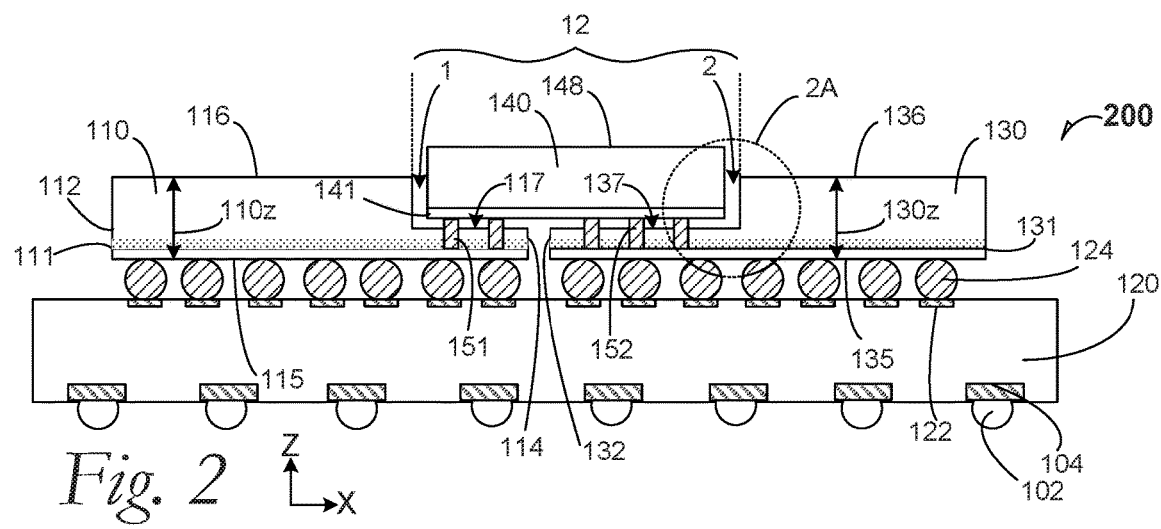
FIG. 2 is a cross-section elevation of the system in package device depicted in FIG. 1 according to an embodiment.

FIG. 2 is a cross-section elevation 200 of the system in package device 100 depicted in FIG. 1, taken along the section line 2-2 according to an embodiment.

The landed first die 110 and the landed subsequent die 130 are disposed on the mounting substrate 120 at a ball grid array, one electrical bump of which is indicated at item 124. The electrical bump 124 contacts a ball pad 122 (which is part of a ball-pad array) on the mounting substrate 120.

The landed first die 110 includes an active surface 115 and the die backside surface 116 and the active surface 115 is a boundary for active devices and metallization 111 for the landed first die 110. In an embodiment, the metallization portion of the active devices and metallization 111 includes metallization configured to contact a first through-silicon via (TSV) 151 at lower metallization numbers and closer to the bulk semiconductive material, e.g. silicon, of the landed first die 110, and the metallization is configured to contact electrical bumps at higher metallization numbers at the electrical bumps 124.

In an embodiment the number of metallizations is N beginning with M1 ("metal one") and ending at MN. The first metallization layer, M1, is the closest metallization to the active devices in the semiconductive material. And MN is the topmost metallization distant from the active devices in the semiconductive material. In an embodiment, the TSV 151 contacts the metallizations including M1 and M2, but no others, and total metallization is between M7 and M14. In an embodiment, M1 begins within item 111 at the silicon of the active surface 115 and MN ends where reference line 115 is touching the electrical bumps 124. In an embodiment where N is e.g., 12, the stacked first die 140 communicates with the landed first die 110 using at least M1 of the landed first die 110, but a number fewer than MN.

In an embodiment where N is greater than seven but less than or equal to 14, the stacked first die 140 communicates with the landed first die 110 using the TSV 151 and only M1. In an embodiment where N is greater than seven but less than or equal to 14, the stacked first die 140 communicates with the landed first die 110 using the TSV 151 and contacting metallization limited to M1 and M2. In an embodiment where N is greater than seven but less than or equal to 14, the stacked first die 140 communicates with the landed first die 110 using metallization limited to M1, M2, and M3. In an embodiment where N is greater than or equal to seven but less than or equal to 14, the stacked first die 140 communicates with the landed first die 110 using half or fewer of metallization layers, beginning with M1 and proceeding sequentially to $MI^{th}$ where I is less than or equal to N/2.

The landed subsequent die 130 includes an active surface 135 and the die backside surface 136 and the active surface 135 is a boundary for active devices and metallization 131 for the landed subsequent die 130. In an embodiment, the metallization portion of the active devices and metallization 131 includes metallization configured to contact a TSV 152 at lower metallization numbers and closer to the bulk semiconductive material of the landed subsequent die 130, and the metallization is configured to contact electrical bumps at higher metallization numbers at the electrical bumps 124. In an embodiment for the landed subsequent die 130 and similar to communication between the stacked first die 140 and the landed first die 110, communication between the stacked first die 140 and the landed subsequent die 130 may be limited to metallization layer numbers less than MN but always beginning with M1. Consequently, each example including M1 as set forth for the landed first die 110 may be applied for the landed subsequent die 130, including any permutation applied to the landed first die 110, differently than applied to the landed subsequent die 130. For example, the TSV 151 contacts M1 and M2 for the active devices and metallization 111 in the landed first die 110, but TSV 152 contacts only an M1 within the landed subsequent die 130.

In an embodiment, a composite contoured recess 12 is formed in part by the landed first die 110 by virtue of the notch 1 that opens part of the die backside surface 116 and opens a part of the x-lateral second edge 114. Similarly, the composite contoured recess 12 is also formed in part by the landed subsequent die 130 by virtue of the notch 2 that opens part of the die backside surface 136 and opens a part of the x-lateral first edge 132. The term "composite contoured recess" is employed since at least two notched dice are used and into which a stacked die is seated.

The stacked first die 140 is seated in the composite contoured recess 12 formed by the notches 1 and 2 according to an embodiment. The system in package device 100 has a lower z-height than if the stacked first die 140 were mounted upon the die backside surfaces 116 and 136, respectively.

In an embodiment, the composite contoured recess 12 is not uniformly deep at the notch 1 and notch 2 where the landed first die 110 has a z-height 110z that is different than the z-height 130z of the landed subsequent die 130. The stacked first die 140 is depicted flip-chip mounted with TSVs (two of which are indicated at items 151 and 152) that contact active devices and metallization 141 therein such that the stacked first die 140 is in electrical communication through the TSVs 151 and 152 with at least one of the landed first die 110 and the landed subsequent die 130.

Figure 2A:
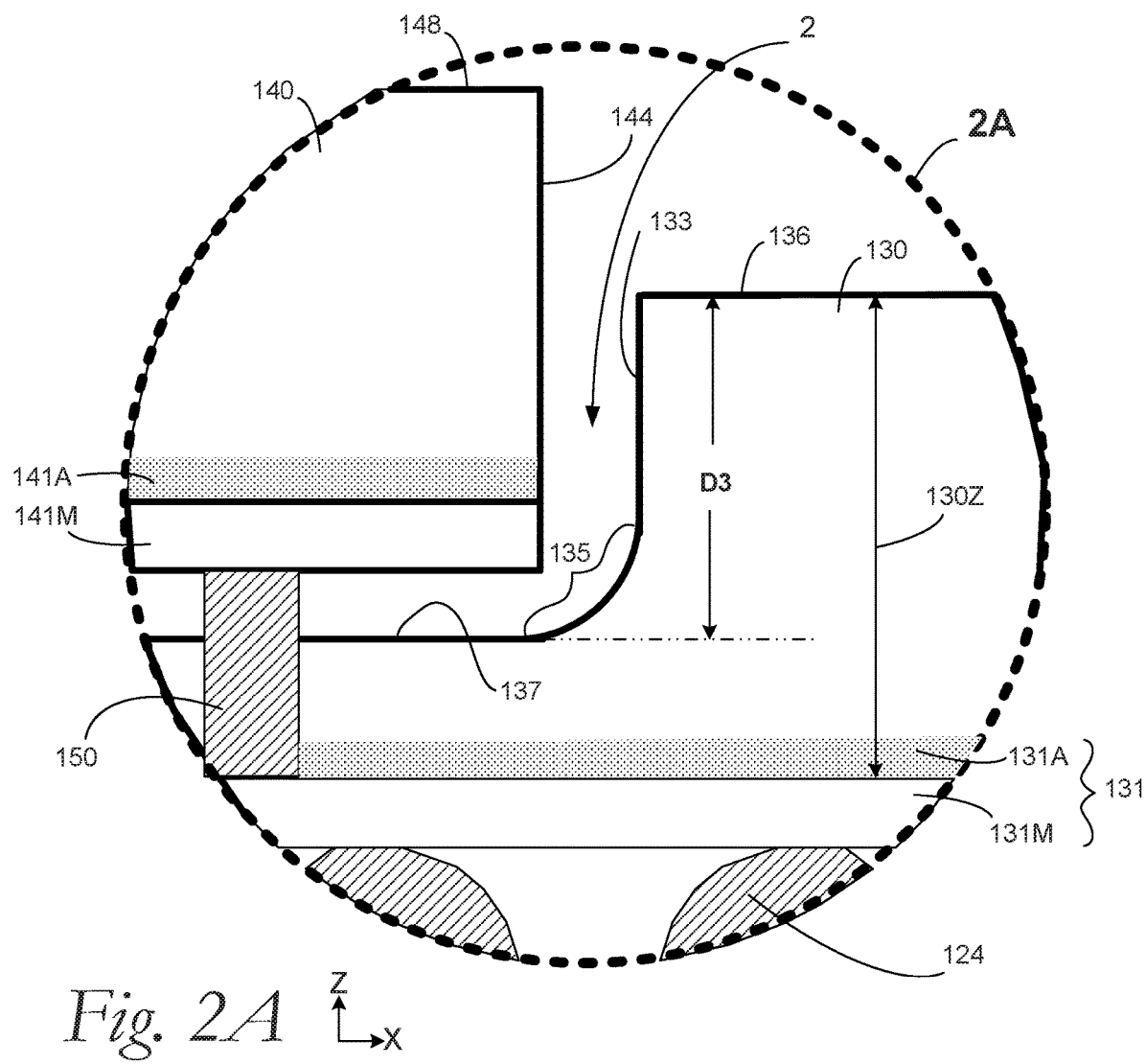
FIG. 2A is a detail section taken along the section circle 2A from FIG. 2 according to an embodiment.

FIG. 2A is a detail section taken along the section circle 2A from FIG. 2 according to an embodiment. The landed subsequent die 130 is seen supporting the stacked first die 140 within the composite contoured recess 12 upon a ledge 137 that is part of the notch 2 that has been opened through the die backside surface 136 and the x-lateral first edge 132 (see FIG. 2) to a depth D3 that is defined in part by a recess wall 133 and the z-component of a contoured section 135. It can be seen the contoured section 135 connects the ledge 137 and the recess wall 133. In an embodiment although the ledge 137 may at a uniform z-height compared to a similar ledge 117 (see FIG. 2) the landed first die 110 has a z-height 110z that is different than the z-height 130z of the landed subsequent die 130. In an embodiment and although the landed first die 110 and landed subsequent die 130 are different device types, both z-heights 110z and 1130z are substantially the same within packaging parameters, and the respective ledges 117 and 137 are also at substantially the same z within the system in package device 100.

More detail of active devices and metallization 131 can be seen by a metallization region 131M. Additionally, an active device region 131A is a processed portion of the bulk semiconductive material 130. Similarly, the active devices and metallization 141 depicted in FIG. 2A as an active device region 141A and a metallization region 141M. In an embodiment, only a metallization 141M is included on the stacked first die 140 as it functions as a passive semiconductive communication bridge.

In an embodiment, the degree of contour for the contoured section 135 is quantified by using microscopy ratios taken from a theoretical unit circle that can be imposed in part along the contoured section 135 and evaluating the diameter, D. For example, a maximum contour length for the contoured section 135 is essentially one-fourth of the arc length of a unit circle and the contoured section 135 has a length of $\pi D/4$ where D is the diameter of the unit circle. In an embodiment, the notch 2 has maximum contour length of $\pi D/4$ at the contoured section 135. In an embodiment, the notch 2 has contour length in a range from $1.0*\pi D/4 > L > 0.25*\pi D/4$. In other words, the contour length 135, L is between maximum and 25% of maximum. In an embodiment, the notch 2 has contour length at the contoured section 135 in a range from $0.9*\pi D/4 > L > 0.3*\pi D/4$. In an embodiment, the notch 2 has contour length at the contoured section 135 in a range from $0.8*\pi D/4 > L > 0.4*\pi D/4$. In an embodiment, the notch 2 has contour length at the contoured section 135 in a range from $0.7*\pi D/4 > L > 0.5*\pi D/4$.

In some instances, quantifying length embodiment of the contoured section 135 may require piecemeal measuring where the contour deviates from an ideal unit circle. In an embodiment, the length, L, at the contoured section 135, can be quantified by microscopy where a unit length such as a 1 micrometer (μm) is mapped onto a portion of the contoured section 135. For example, the contoured section 135 might be estimated at, e.g. 5.25 μm, which would be five and one-fourth of 1 μm lengths that can be mapped on to the entire contoured section 135. The particular contour and length of contouring can be formed by processing parameters that may be known in the art.

Figure 3:
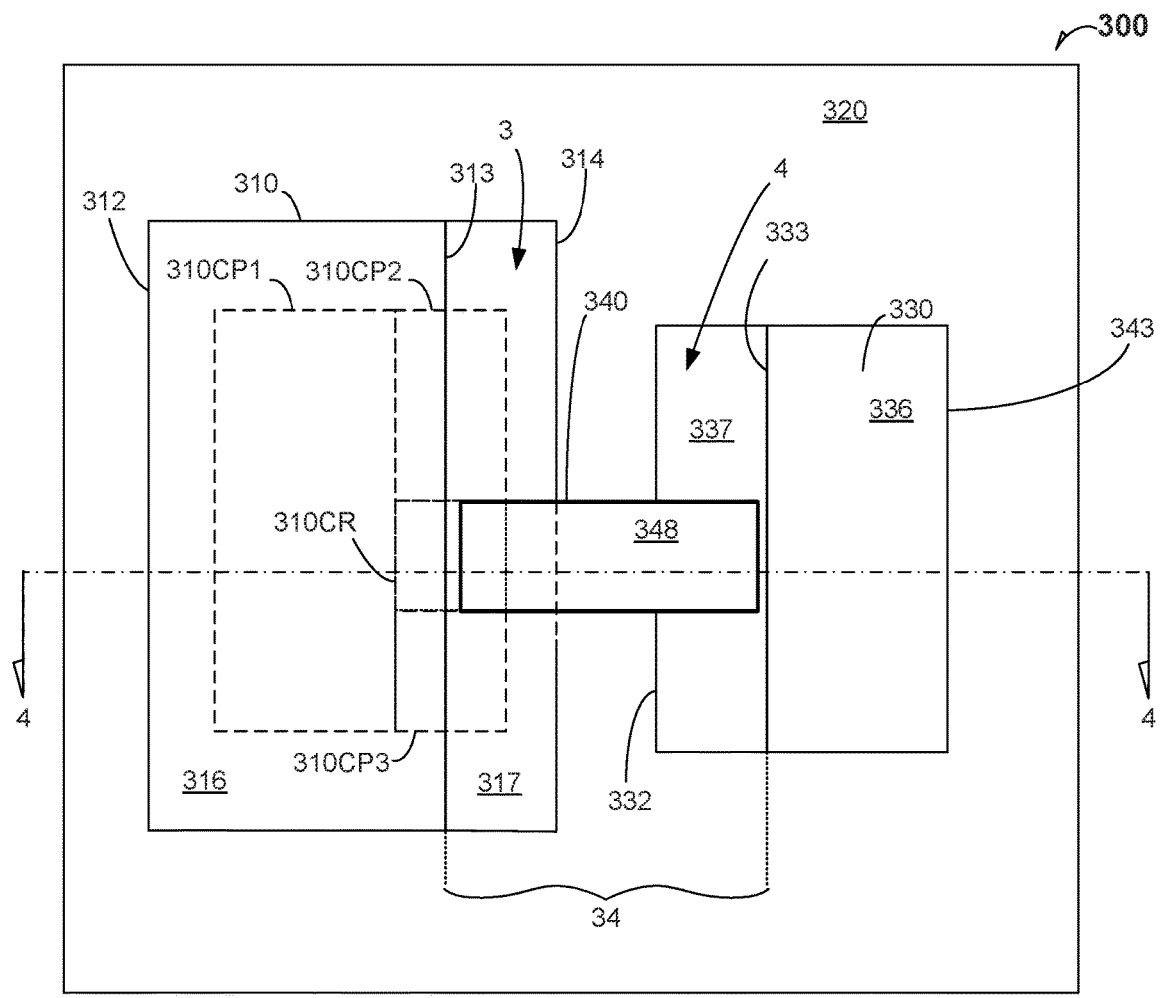
FIG. 3 is top plan of a system in package device with a landed first die, a landed subsequent die, and a stacked first die that is mounted in a composite recess according to an embodiment.

FIG. 3 is top plan of a system in package device 300 with a landed first die 310, a landed subsequent die 330, and a stacked first die 340 that is mounted in a composite contoured recess 34 according to an embodiment.

The landed first die 310 and the landed subsequent die 330 are disposed on a mounting substrate 320 and the stacked first die 340 is disposed in a composite recess 34 formed by respective notches 3 and 4 on the landed first- and subsequent dice 310 and 330. The stacked first die 340 includes a stacked first die backside surface 348.

The landed first die 310 includes a first die backside surface 316, an x-lateral first edge 312 and an x-lateral second edge 314. The notch 3 is defined in part by a recess wall 313 and a ledge 317 where the notch 3 opens a portion of the die backside surface 316 and the x-lateral second edge 314.

The landed subsequent die 330 includes a subsequent die backside surface 336, an x-lateral first edge 332 and an x-lateral second edge 334. Similarly, the notch 4 is defined in part by a recess wall 333 and a ledge 337 where the notch 4 opens a portion of the die backside surface 336 and the x-lateral first edge 332.

In an embodiment, the landed first die 310 is a CPU such as a processor made by Intel Corporation of Santa Clara, Calif. In an embodiment, the landed subsequent die 330 is a memory die such as a non-volatile memory. In an embodiment, the stacked first die 340 is a silicon bridge that connects the landed first die 310 to the landed subsequent die 330.

In an embodiment, the landed first die 310 is a multifunction processor such as a multiple-core processor. In an embodiment, the landed first die 310 includes a first core partition 310CP1, a second core partition 310CP2, and a subsequent core partition 310CP3. In an embodiment the landed first die 310 additionally includes an input-output (I/O) core region 310CR that is formed between the respective second- and subsequent core partitions 310CP2 and 310CP3 and bounded on a third side by the first core partition 310CP1. In an embodiment, the I/O core region 310CR is configured to assist I/O communication die-to-die without using any bumps, pads, and traces of the package substrate 320 and also by using a subset of the metallization 311 (see FIG. 4) within the landed first die 310, starting with M1.

Figure 4:
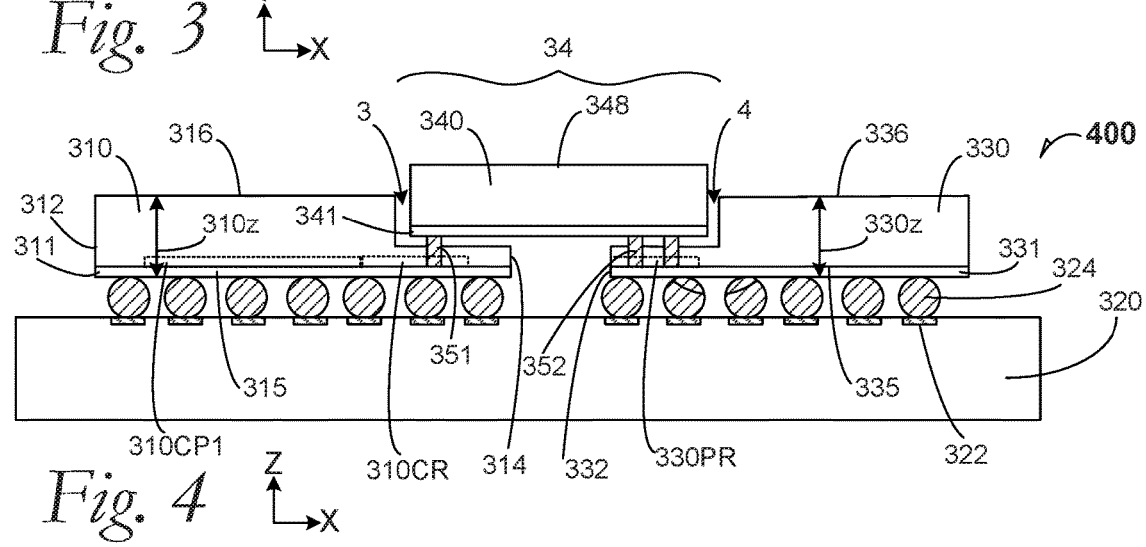
FIG. 4 is a cross-section elevation of the system in package device depicted in FIG. 3 according to an embodiment.

FIG. 4 is a cross-section elevation 400 of the system in package device 300 depicted in FIG. 3, taken along the section line 4-4 according to an embodiment.

The landed first die 310 and the landed subsequent die 330 are disposed on the mounting substrate 320 at a ball grid array, one electrical bump of which is indicated at item 324. The electrical bump 324 contacts a ball pad 322 (which is part of a ball-pad array) on the mounting substrate 320.

The landed first die 310 includes an active surface 315 and the die backside surface 316 and the active surface 315 is a boundary for active devices and metallization 311 for the landed first die 310. In an embodiment, the metallization portion of the active devices and metallization 311 includes metallization configured to contact a first TSV 351 at lower metallization numbers and closer to the bulk semiconductive material, e.g. silicon, of the landed first die 310, and the metallization is configured to contact electrical bumps at higher metallization numbers at the electrical bumps 324.

Similar to embodiments described for the system in package device 100 depicted in FIGS. 1 and 2, the TSV 351 contacts lower metallization layers in item 311. Consequently in non-equivalent embodiments, the TSV may contact M1 alone, just M1 and M2, just M1, M2 and M3, and M1 plus up to and including MI$^{th}$ that is to less than or equal to MN/2.

The landed subsequent die 330 includes an active surface 335 and the die backside surface 336 and the active surface 335 is a boundary for active devices and metallization 331 for the landed subsequent die 330. In an embodiment, the metallization portion of the active devices and metallization 331 includes metallization configured to contact a TSV 352 at lower metallizations and closer to the bulk semiconductive material of the landed subsequent die 330, and the metallization is configured to contact electrical bumps at higher metallization numbers at the electrical bumps 324. For the landed subsequent die 330 and similar to communication between the stacked first die 340 and the landed first die 310, communication between the stacked first die 340 and the landed subsequent die 330 may be limited to metallization layer numbers less than MN but always beginning with M1. Consequently, each example including M1 as set forth for the landed first die 310 may be applied for the landed subsequent die 330, including any permutation applied to the landed first die 310 differently than applied to the landed subsequent die 330.

In an embodiment, a composite contoured recess 34 is formed in part by the landed first die 310 by virtue of the notch 3 that opens part of the die backside surface 316 and opens a part of an x-lateral second edge 314. Similarly, the composite contoured recess 34 is also formed in part by the landed subsequent die 330 by virtue of the notch 4 that opens part of the die backside surface 338 and opens a part of an x-lateral first edge 332. It can be seen from the plan view in FIG. 3 that the composite contoured recess 34 is only partial with respect to the x-y form factors of each of the landed first- and subsequent dice 310 and 330, respectively. With respect to the stacked first die 340 in the x-y directions, the stacked first die 340 is disposed at least in part in a composite contoured recess 34 formed by the notches 3 and 4, respectively.

The stacked first die 340 is seated in the composite contoured recess 34 formed by the notches 3 and 4 according to an embodiment. The system in package device 300 has a lower z-height than if the stacked first die 340 were mounted upon the die backside surfaces 316 and 336, respectively.

In an embodiment, the composite contoured recess 34 is not uniformly deep at the notch 3 and notch 4 where the landed first die 310 has a z-height 310z that is different than the z-height 330z of the landed subsequent die 330. In an embodiment and although the landed first die 310 and landed subsequent die 330 are different device types, both z-heights 310z and 330z are substantially the same within packaging parameters, and the respective ledges 317 and 337 are also at substantially the same z within the system in package device 300. The stacked first die 340 is depicted flip-chip mounted with TSVs (two of which are indicated at items 351 and 352) that contact active devices and metallization 341 such that the stacked first die 340 is in electrical communication through the TSVs 351 and 352 with at least one of the landed first die 310 and the landed subsequent die 330.

In an embodiment where the landed first die 310 is a core processor, the I/O core region 310CR may be located near the x-lateral second edge 314, but still not be adjacent and including the x-lateral second edge 314. Consequently where the TSV 351 contacts the I/O core region 310CR appropriate circuitry assists with I/O processing between the landed first die 310 and the stacked first die 340.

In an embodiment where the landed subsequent die 330 includes platform-controller hub (PCH) functionality, an I/O peripheral region 330PR may be located adjacent- and touching the x-lateral first edge 332 to facilitate edge proximity connectivity such as for a memory die that includes a PCH function. Consequently where the TSV 352 contacts the I/O peripheral region 330PR appropriate circuitry assists with I/O processing between the landed subsequent die 330 and the stacked first die 340.

Figure 5:
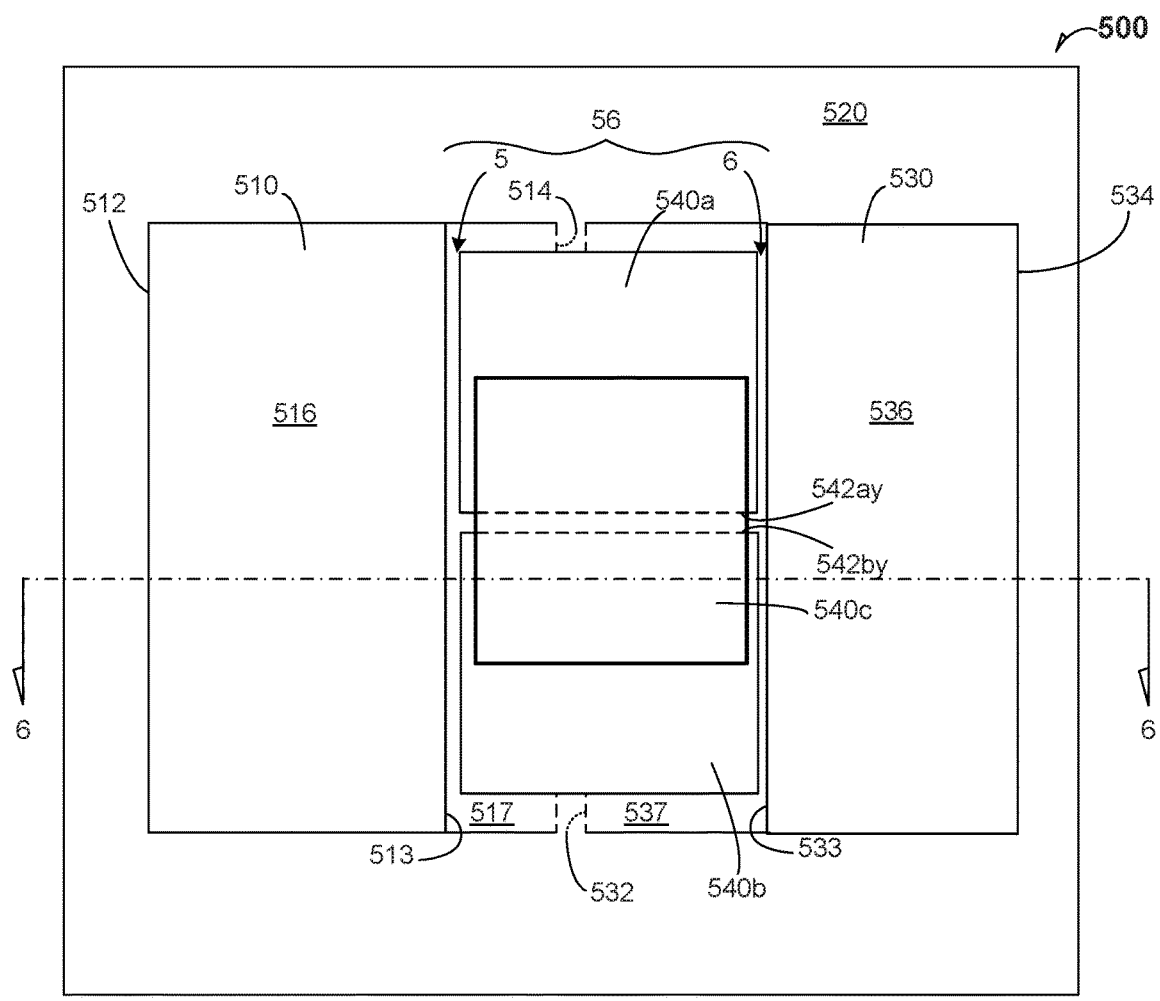
FIG. 5 is top plan of a system in package device with a landed first die, a landed subsequent die, a stacked first die, a stacked subsequent, and a second-tier first die according to an embodiment.

FIG. 5 is top plan of a system in package device 500 with a landed first die 510, a landed subsequent die 530, and a stacked first die 540a, a stacked subsequent die 540b, and a second-tier first die 540c according to an embodiment. The term "second-tier" refers to a die that has a stacked die beneath it in the z-dimension such that the stacked die is closer to the package substrate than the second-tier die and the stacked die is disposed upon at least in part on a landed die.

The landed first die 510 and the landed subsequent die 530 are disposed on a mounting substrate 520 and the stacked first die 540a is disposed in a composite recess 56 formed by respective notches 5 and 6 on the landed first- and subsequent dice 510 and 530.

The landed first die 510 includes a first die backside surface 516, an x-lateral first edge 512 and an x-lateral second edge 514. The landed subsequent die 530 includes a subsequent die backside surface 536, an x-lateral first edge 532 and an x-lateral second edge 534.

In an embodiment, the landed first die 510 is a CPU such as a processor made by Intel Corporation of Santa Clara, Calif. In an embodiment, the landed subsequent die 530 is a memory die such as a non-volatile memory. In an embodiment, the stacked first die 540a is a semiconductive bridge that connects the landed first die 510 to the landed subsequent die 530. In an embodiment, the stacked subsequent die 540b is a semiconductive bridge that connects the landed first die 510 to the landed subsequent die 530. In an embodiment, one of the stacked first die 540a and the stacked subsequent die 540b is a semiconductive bridge and the other thereof has active devices and no intrinsic bridge functions. Each of the first- and subsequent stacked dice 540a and 540b are seated on respective ledges 517 and 537.

In an embodiment, the second-tier first die 540c bridges respective y-lateral edges 542ay and 542by of the stacked first- and subsequent dice 540a and 540b.

Figure 6:
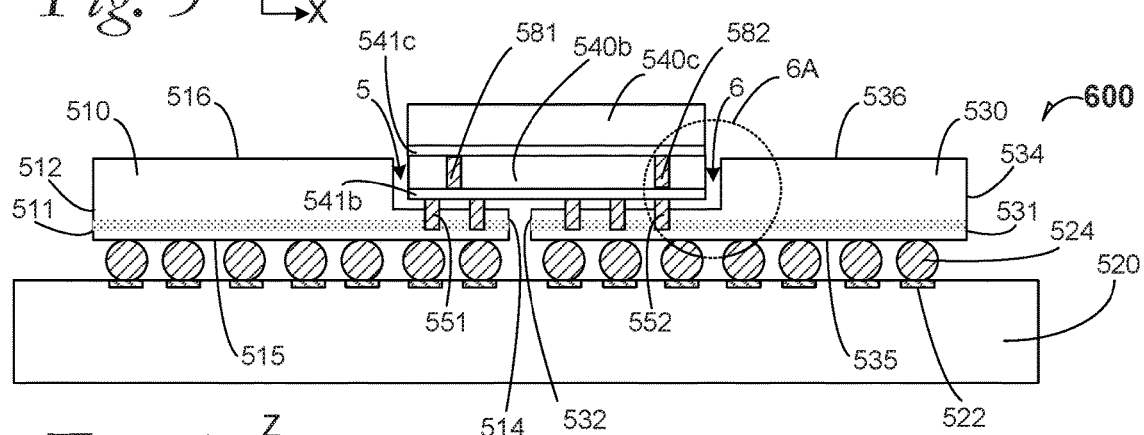
FIG. 6 is a cross-section elevation of the system in package device depicted in FIG. 5 according to an embodiment.

FIG. 6 is a cross-section elevation 600 of the system in package device 500 taken along the section line 6-6 depicted in FIG. 5 according to an embodiment. The section line 6-6 intersects the landed first die 510, the landed subsequent die 530 the package substrate 520, the stacked subsequent die 540b, and the second-tier first die 540c.

The landed first die 510 and the landed subsequent die 530 are disposed on the mounting substrate 520 at a ball grid array, one electrical bump of which is indicated at item 524. The electrical bump 524 contacts a ball pad 522 (which is part of a ball-pad array) on the mounting substrate 520.

The landed first die 510 includes an active surface 515 and the die backside surface 516 and the active surface 515 is a boundary for active devices and metallization 511 for the landed first die 510. In an embodiment, the metallization portion of the active devices and metallization 511 includes metallization configured to contact a first TSV 551 for lower metallization numbers and closer to the bulk semiconductive material, e.g. silicon, of the landed first die 510, and the metallization is configured to contact electrical bumps at higher metallization numbers at the electrical bumps 524.

Similar to- and including each of the embodiments described for the system in package devices 100 and 300 depicted in FIGS. 1 and 3, the TSV 551 contacts lower metallization layers in item 511.

The landed subsequent die 530 includes an active surface 535 and the die backside surface 536 and the active surface 535 is a boundary for active devices and metallization 531 for the landed subsequent die 530. In an embodiment, the metallization portion of the active devices and metallization 531 includes metallization configured to contact a TSV 552 for lower metallization numbers closer to the bulk semiconductive material of the landed subsequent die 530, and the metallization is configured to contact electrical bumps at higher metallization numbers at the electrical bumps 524. For the landed subsequent die 530 and similar to communication between the stacked first die 540 and the landed first die 510, communication between the stacked second die 540b and the landed subsequent die 530 may be limited to metallization layer numbers less than MN but always beginning with M1. Consequently, each example including M1 as set forth for the landed first die 510 may be applied for the landed subsequent die 530, including any permutation applied to the landed first die 510 differently than applied to the landed subsequent die 530.

As illustrated in FIG. 6, the second-tier first die 540c is in electrical communication with the stacked subsequent die 540b through active devices and metallization 541c and at least one TSV 581 or 582. For example, substantially vertically aligned TSVs 552 and 582 may form a shorter vertical electrical path from the second-tier first die 540c to the landed subsequent die 530. In an embodiment, TSVs 551 and 581 may form a less than vertical and therefore longer electrical path from the second-tier first die 540c to the landed subsequent die 530.

In an embodiment, a composite contoured recess 56 is formed in part by the landed first die 510 by virtue of the notch 5 that opens part of the die backside surface 516 and opens a part of the x-lateral second edge 514. Similarly, the composite contoured recess 56 is also formed in part by the landed subsequent die 530 by virtue of the notch 6 that opens part of the die backside surface 536 and opens a part of the x-lateral first edge 532. It can be seen from the plan view in FIG. 5 that the composite contoured recess 56 is only partial with respect to the x-y form factors of each of the landed first- and subsequent dice 510 and 530, respectively. With respect to the stacked subsequent die 540b in the x-y directions, the stacked subsequent die 540b is disposed at least in part in a composite contoured recess formed by the notches 5 and 6, respectively.

The stacked subsequent die 540b is seated in the composite contoured recess 56 formed by the notches 5 and 6 according to an embodiment. The system in package device 500 has a lower z-height than if the stacked first die 540b were mounted upon the die backside surfaces 516 and 536, respectively.

The stacked subsequent die 540b is depicted flip-chip mounted with TSVs (two of which are indicated at items 551 and 552) that contact active devices and metallization 541b such that the stacked second die 540b is in electrical communication through the TSVs 551 and 552 with at least one of the landed first die 510 and the landed subsequent die 530. Similar to different z-height embodiments described for first- and subsequent dice 110 and 130 and 310 and 330, the first- and subsequent landed dice 510 and 530 may also have differing z-heights. Similarly also, the respective z-heights may be essentially the same within semiconductor packaging parameters.

In an embodiment, the second-tier first die 540c is a memory die that may be controlled by the stacked second die 540b. In an embodiment, the second-tier first die 540c is a baseband die for radio-frequency (RF) communication.

Figure 6A:
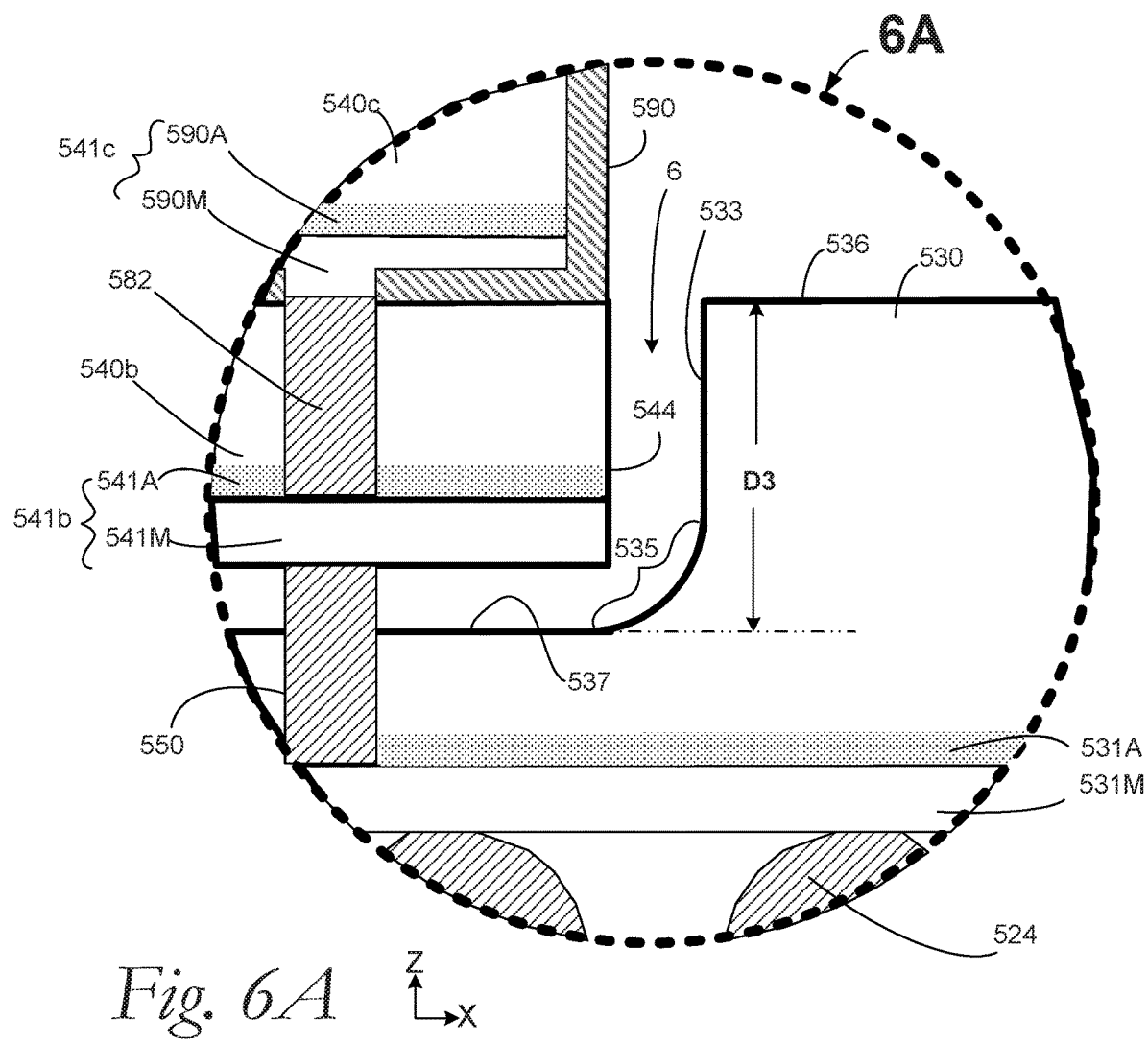
FIG. 6A is a detail section taken along the section circle 6A from FIG. 6 according to an embodiment.

FIG. 6A is a detail section taken along the section circle 6A from FIG. 6 according to an embodiment. The landed subsequent die 530 is seen supporting the stacked subsequent die 540b within the contoured recess upon a ledge 537 that is part of the notch 6 that has been opened through the die backside surface 536 and the lateral first edge 532 (see FIG. 6) to a depth D3 that is defined in part by a recess wall 533 and the z-component of a contoured section 535. It can be seen the contoured section 535 connects the ledge 537 and the recess wall 533.

More detail of active devices and metallization 531 can be seen by a metallization region 531M and an active device region 531A that is a processed portion including the bulk semiconductive material 540. Similarly, the active devices and metallization 541b depicted in FIG. 6 is further defined by an active device region 541A and a metallization region 541M in the stacked subsequent die 540b. In an embodiment, only a metallization 541M is included on the stacked subsequent die 540b.

In an embodiment, the stacked subsequent die 540b is a memory die, the stacked first die 540a (see FIG. 5) is a semiconductive bridge, and the second-tier first die 540c is a baseband die for RF communication that includes a shield 590, also referred to as a Faraday shield, to reduce electromagnetic interference. In an embodiment the shield 590 is a single metal film. Both an active area 590A and a metallization area 590M are depicted in the second-tier first die 540c. Where the second-tier first die 540c is a baseband die, the shield 590 allows an open through which the metallization area 590M communicates to the TSV 582.

Figure 7:
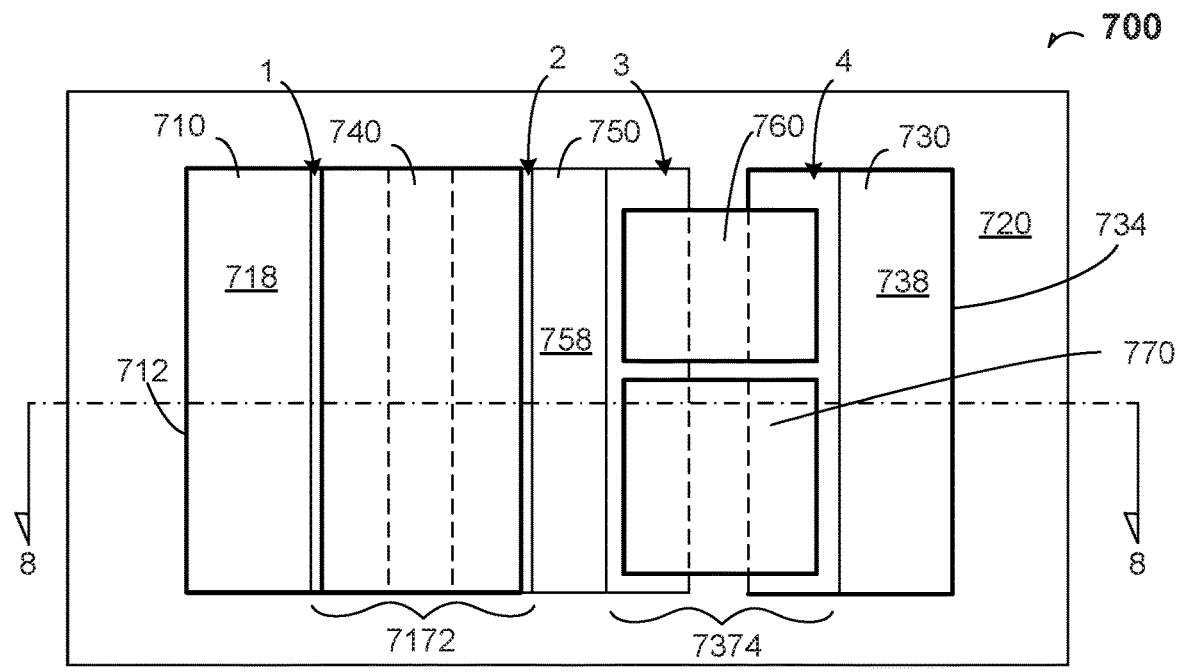
FIG. 7 is top plan of a system in package device with a landed first die, a landed subsequent die, a landed third die, a stacked first die disposed in a composite recess on the landed first- and third dice, respectively, and a stacked subsequent die disposed on the landed third die and the landed subsequent die according to an embodiment.

FIG. 7 is top plan of a system in package device 700 according to an embodiment. The system in package device 700 includes three landed dice: a landed first die 710, a landed subsequent die 730 and a landed third die 750. Additionally, the system in package device 700 includes a stacked first die 740, a stacked subsequent die 760, and a stacked third die 770.

Similar to other disclosed embodiments, a notch 1 opens a portion of a die backside surface 718 and a composite recess 7172 is completed with a notch 2 in the landed third die 750 that opens a portion of a die backside surface 758. The stacked first die 740 is a semiconductive bridge between the respective landed first- and third dice 710 and 750. Additionally in an embodiment, a notch 3 opens a different portion of the die backside surface 758 and a composite recess 7374 is completed with a notch 4 in the landed subsequent die 730 that opens a portion of a die backside surface 738.

In an embodiment, the landed first die 710 is a processor such as a processor made by Intel Corporation, and the stacked first die 740 is a semiconductive bridge therefrom to the landed third die 750. In an embodiment, the landed third die 750 is a nonvolatile memory die that includes an PCH and the landed subsequent die 730 is also a memory die that is controlled in part by the PCH in the landed third die 750. Further the stacked subsequent die 760 is a semiconductive bridge between the respective landed third- and subsequent dice 750 and 730, and the stacked third die 770 is a shielded baseband processor.

Figure 8:
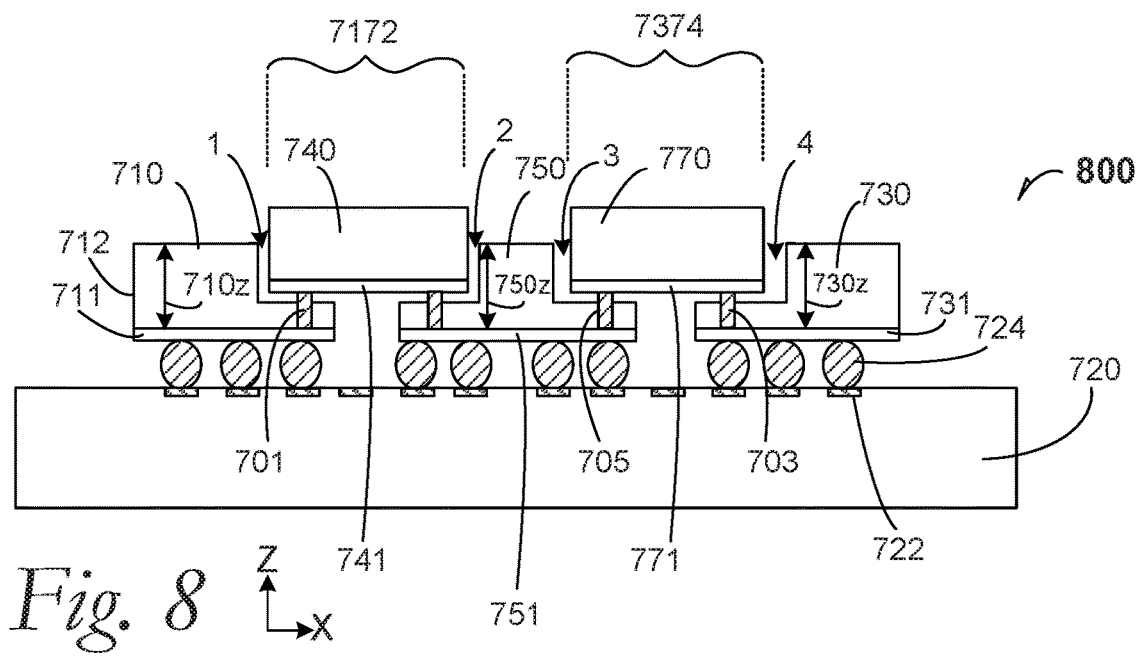
FIG. 8 is a cross-section elevation of the system in package device depicted in FIG. 7 according to an embodiment.

FIG. 8 is a cross-section elevation of the system in package device 700 depicted in FIG. 7 according to an embodiment.

The landed first die 710, the landed third die 750 and the landed subsequent die 730 are disposed on the mounting substrate 720 at a ball grid array, one electrical bump of which is indicated at item 724. The electrical bump 724 contacts a ball pad 722 (which is part of a ball-pad array) on the mounting substrate 720.

Similar to other disclosed embodiments, respective regions for active devices and metallization 711, 751 and 731 are found on respective landed first-third, and subsequent dice. Also similar to other disclosed embodiments, metallizations are contacted by respective TSVs 701, 705 and 703 with contact permutations such as just M1, just M1 and M2, just M1, M2 and M3, and up to MN/2. Consequently, each example including M1 as set forth for the landed first die 710 may be applied differently or the same for each of the landed subsequent die 730 and the landed third die 750 including any permutation applied to the landed first die 710 differently than applied to the landed subsequent die 730, and also differently for the landed third die 750.

Two composite contoured recesses 7172 and 7374 are also depicted, which are formed by the respective notches 1, 2, 3, and 4.

The stacked first die 740 includes active devices and metallization 741 and is seated in the composite contoured recess 7172. And the stacked subsequent die 770 includes active devices and metallization 771 and is seated in the composite contoured recess 7374. The system in package device 700 has a lower z-height than if the stacked dice were mounted upon the landed die backside surfaces.

In an embodiment, the composite contoured recess 7172 is not uniformly deep at the notch 1 and notch 2 where the landed first die 710 has a z-height 710z that is different than the z-height 750z of the landed third die 750. In an the embodiment, the composite contoured recess 7374 is not uniformly deep at the notch 3 and notch 4 where the landed subsequent die 730 has a z-height 730z that is different than the z-height 750z of the landed third die 750. In an embodiment and although the landed first die 710, the landed third die 750 and landed subsequent die 730 are different device types, all three z-heights 710z, 750z, and 730z are substantially the same within packaging parameters, and the respective ledges are also at substantially the same z within the system in package device 700.

Figure 9:
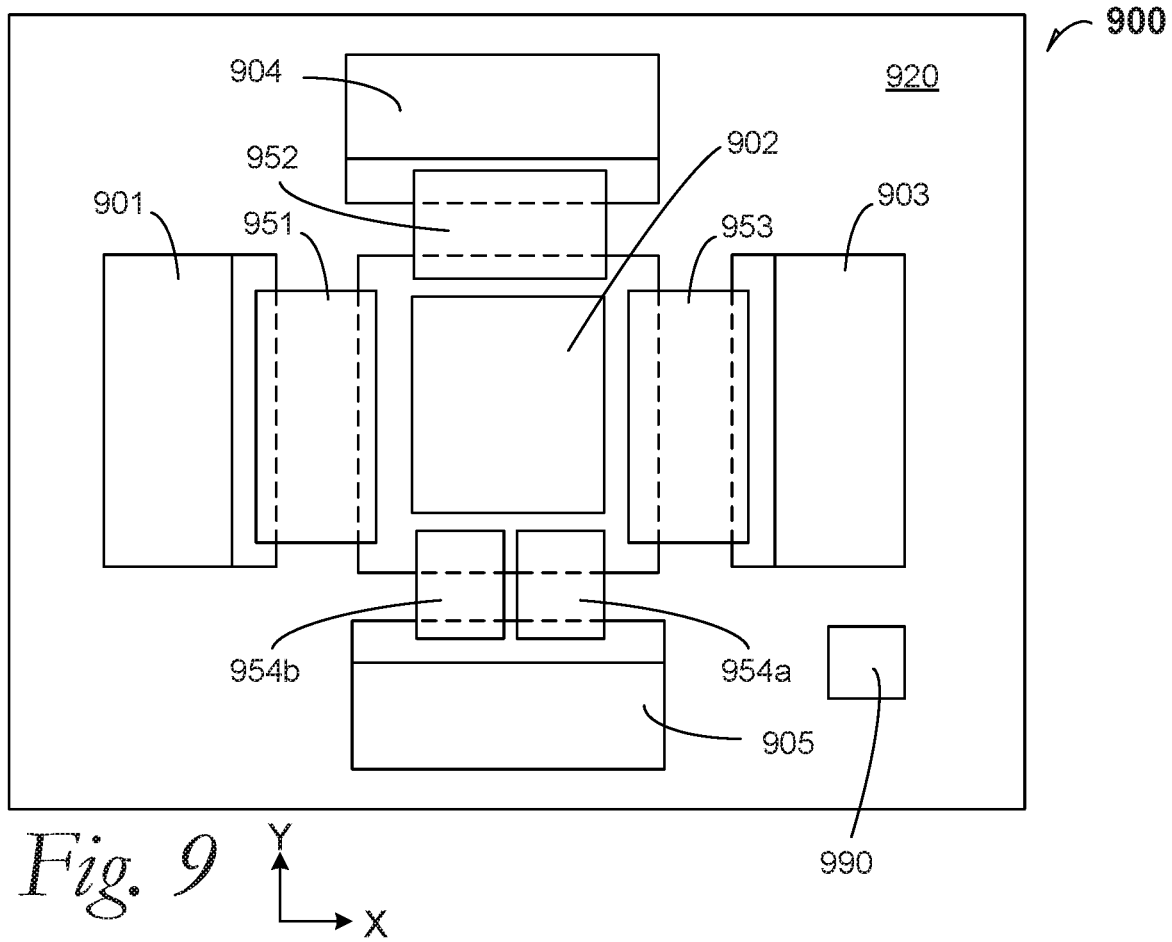
FIG. 9 is top plan of a system in package device that includes up to five landed dice and up to at least four stacked dice according to an embodiment.

FIG. 9 is top plan of a system in package device 900 that includes up to five landed dice and up to at least up to four stacked dice according to an embodiment. In an embodiment, at least three landed dice are connected to a package substrate and at least one stacked die connects two of the at least three landed dice.

In an embodiment, up to five landed dice are disposed upon a mounting substrate 920 including a landed first die 901, a landed second die 902, a landed third die 903, a landed fourth die 904, and a landed subsequent die 905. At least one stacked die is also disclosed according to an embodiment. As depicted, the SiP device 900 may include a stacked first die 951, a stacked second die 952, a stacked third die 953, a stacked fourth die 954a and a stacked subsequent die 954b.

In an embodiment, the landed second die 902 is a CPU such as a processor made by Intel Corporation of Santa Clara, Calif. In an embodiment, the landed first die 901 is a memory die such as a non-volatile memory, and the stacked first die 951 is a semiconductive bridge that connects the respective landed first- and second dice 901 and 902.

In an embodiment, landed dice 901, 902, and 903 are electrically coupled with stacked dice 951 and 953. In this embodiment, a substantially linear arrangement of five dice is disclosed. In an embodiment, a substantially right-angle arrangement including landed dice 901, 902, and 904 are electrically coupled with stacked dice 951 and 952. In this embodiment, a substantially right-angle arrangement of five dice is disclosed where the landed second die 902 is at the right-angle apex. In an embodiment, a substantially T-shaped arrangement of landed dice 901, 902, 903 and 904 is coupled with stacked dice 951, 952 and 953. In an embodiment, a substantially T-shaped arrangement of landed dice 901, 902, 903 and 905 is coupled with stacked dice 951, 953 and at least one of 954a and 954b. In an embodiment, a substantially cross-shaped arrangement of landed dice 901, 902, 903, 904 and 905 is coupled with stacked dice 951, 952, 953 and at least one of 954a and 954b.

In an embodiment, only one of the stacked fourth- and subsequent dice 954a and 954b serves as a semiconductive bridge between the respective landed second- and subsequent dice 902 and 905. In an embodiment where the landed second die 902 is a CPU, one of the other landed dice (any one of dice 901, 903, 904 and 905) is a shielded baseband RF die and a stacked die therebetween is a semiconductive bridge.

In an embodiment, a component 990 is also mounted on the package substrate 920 but is coupled to at least one of the other devices through connections within the package substrate 920. Within this disclosure, a "component" refers to a semiconductive device according to an embodiment. Within this disclosure, a "component" refers to a passive device such as a balun, a capacitor, a resistor, an inductor and the like according to an embodiment. It is now understood that all illustrated Figures may include a component embodiment mounted upon any of the packaging substrates 120, 320, 520, 720, 920, and as part of the computing system depicted in FIG. 12 such as a component 1290 part of the chipset 1220.

Figure 9P:
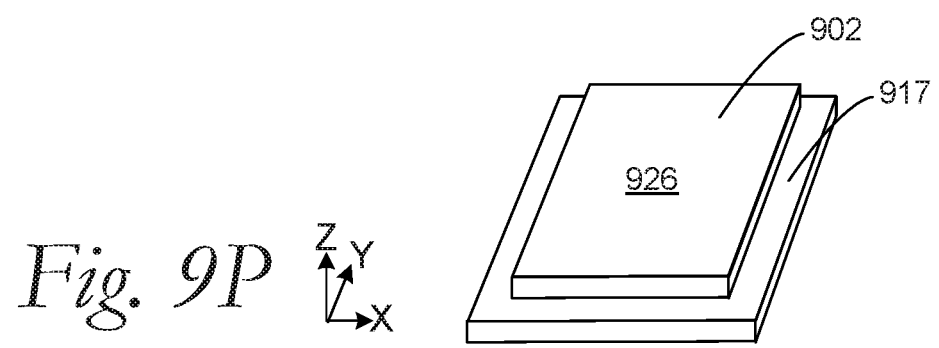
FIG. 9P is a 3-dimensional perspective of the landed second die depicted in FIG. 9 according to an embodiment

FIG. 9P is a 3-dimensional perspective of the landed second die 902 depicted in FIG. 9 according to an embodiment. A ledge 917 is depicted that allows mounting of at least one stacked die thereupon by a process of opening the die backside surface 926 at the perimeter thereof.

FIGS. 10A through 10D represent processing a wafer for configuring at least one landed die with a contoured recess and a ledge according to an embodiment.

A semiconductive wafer 1001, for example, bulk silicon has been processed to achieve active devices and metallization 111. At FIG. 10A, the semiconductive wafer 1001 is mounted upon a carrier film 130 such as a Mylar based tape.

Figure 10A:
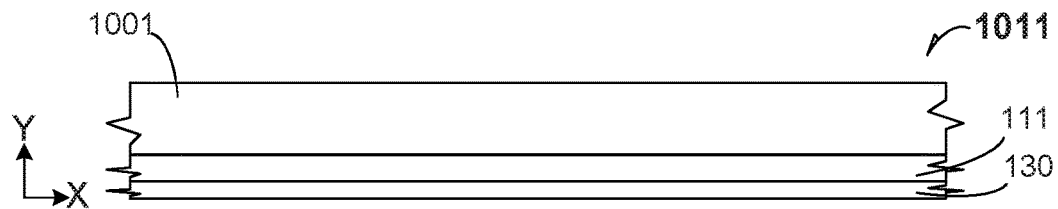
FIGS. 10A, 10B, 10C and 10D illustrate a process flow for creating a contoured recess with a landed die ledge that opens a die backside according to an embodiment.
Figure 10B:
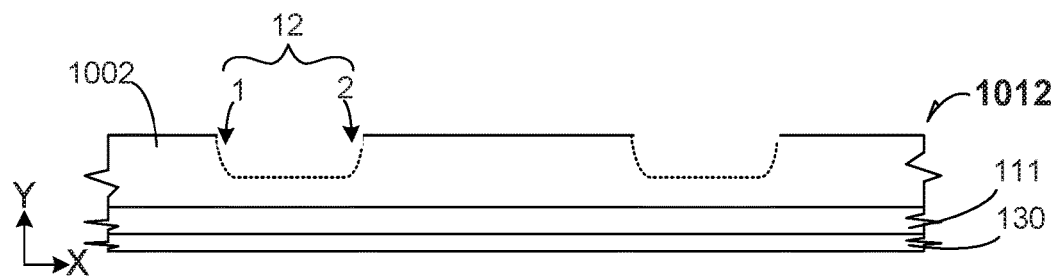

At FIG. 10B, a recess 12 is formed by chemical processing to transform the wafer 1001 in FIG. 10A to the wafer 1002. Chemical processing may be done such as by modified isotropic wet etching such that contoured notches 1 and 2 are formed that leaves a sidewall, a contoured section, and a ledge. In an embodiment, a directional etch is started such as through a mask, followed either by anisotropic etch modification or isotropic etching to form a contoured section.

Figure 10C:
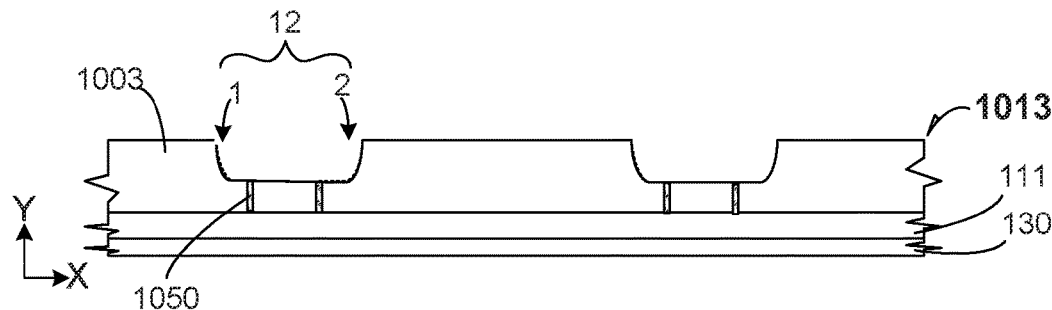

At FIG. 10C, a TSV 1050 is formed in the wafer 1003 such as by physical drilling, followed by TSV forming either by electroless or electrolytic plating. In an embodiment, laser drilling of a via corridor is carried out, followed by TSV forming either by electroless or electrolytic plating.

Figure 10D:
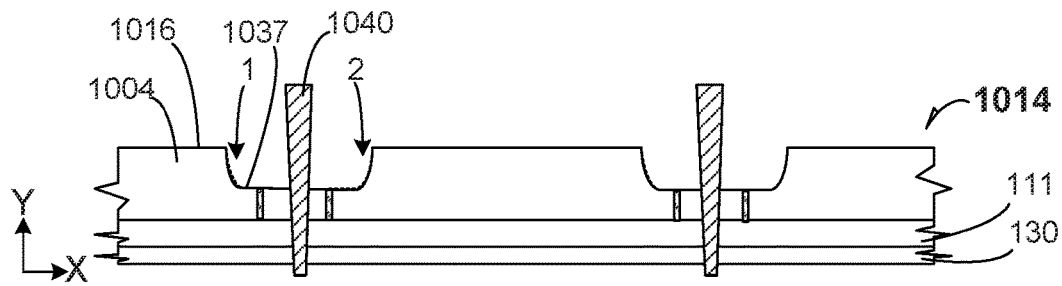

At FIG. 10D, wafer dicing is carried out such as with a dicing saw 1040 to form a die 1004 with a notch that opens a portion of a backside surface 1016 and that is configured to be a landed die such as any of the landed die embodiments depicted in this disclosure. These embodiments may be carried out such as by die attach processing and die stacking.

Figure 11:
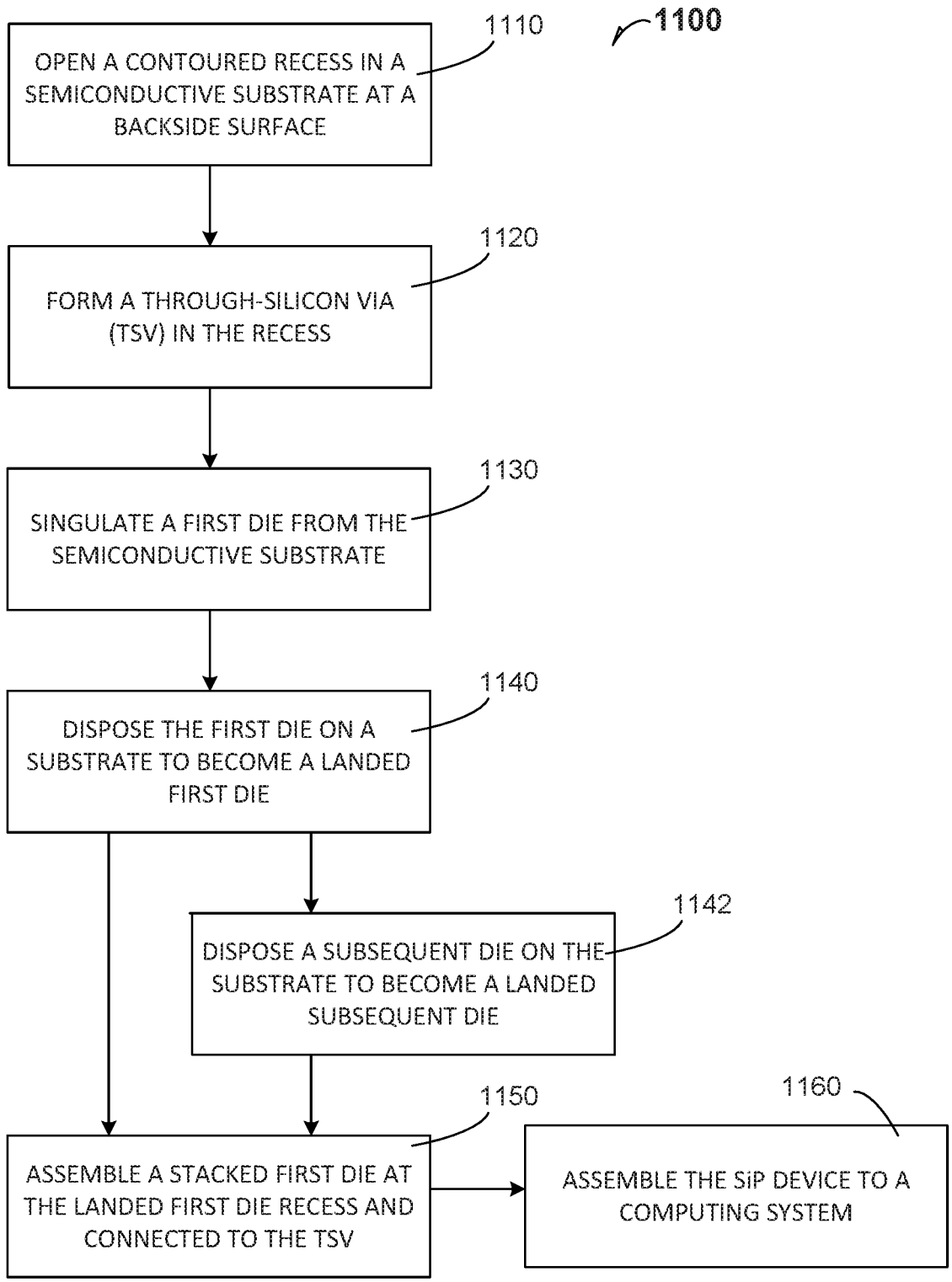
FIG. 11 is a process flow diagram depicting processing methods according to several embodiments.

FIG. 11 is a process flow diagram depicting processing methods according to several embodiments.

At 1110, the process includes opening a contoured recess in a semiconductive substrate at a backside surface. By way of non-limiting example, the semiconductive wafer 1001 depicted in FIG. 10A is processed to form a contoured recess 12 as depicted in FIG. 10B.

At 1120, the process includes forming a TSV in the recess. By way of non-limiting example, laser drilling followed by electroplating a TSV 1050 is carried out as depicted at FIG. 10C.

At 1130, the process includes singulating a first die from the semiconductive substrate. By way of non-limiting example a dicing saw 1040 singulates a die 1004 as depicted in FIG. 10D.

At 1140, the process includes disposing a first die on a substrate to become a landed first die. By way on non-limiting example, the landed first die 110 depicted in FIG. 1, is disposed upon the package substrate 120.

At 1142, the process includes disposing a subsequent die with a notch on the substrate to become a landed subsequent die.

At 1150, the process includes assembling a first stacked die at the landed first die recess and connected to the TSV. By way of non-limiting example, the first stacked die 140 is assembled to the landed first die 110 as depicted in FIG. 2. In an embodiment, the process initiates and terminates respectively at 1110 and 1150. In an embodiment, the process initiates and terminates respectively at 1140 and 1150. In an embodiment, the process initiates and terminates at 1150.

At 1160, the process includes assembling the system in package device to a computing system.

Figure 12:
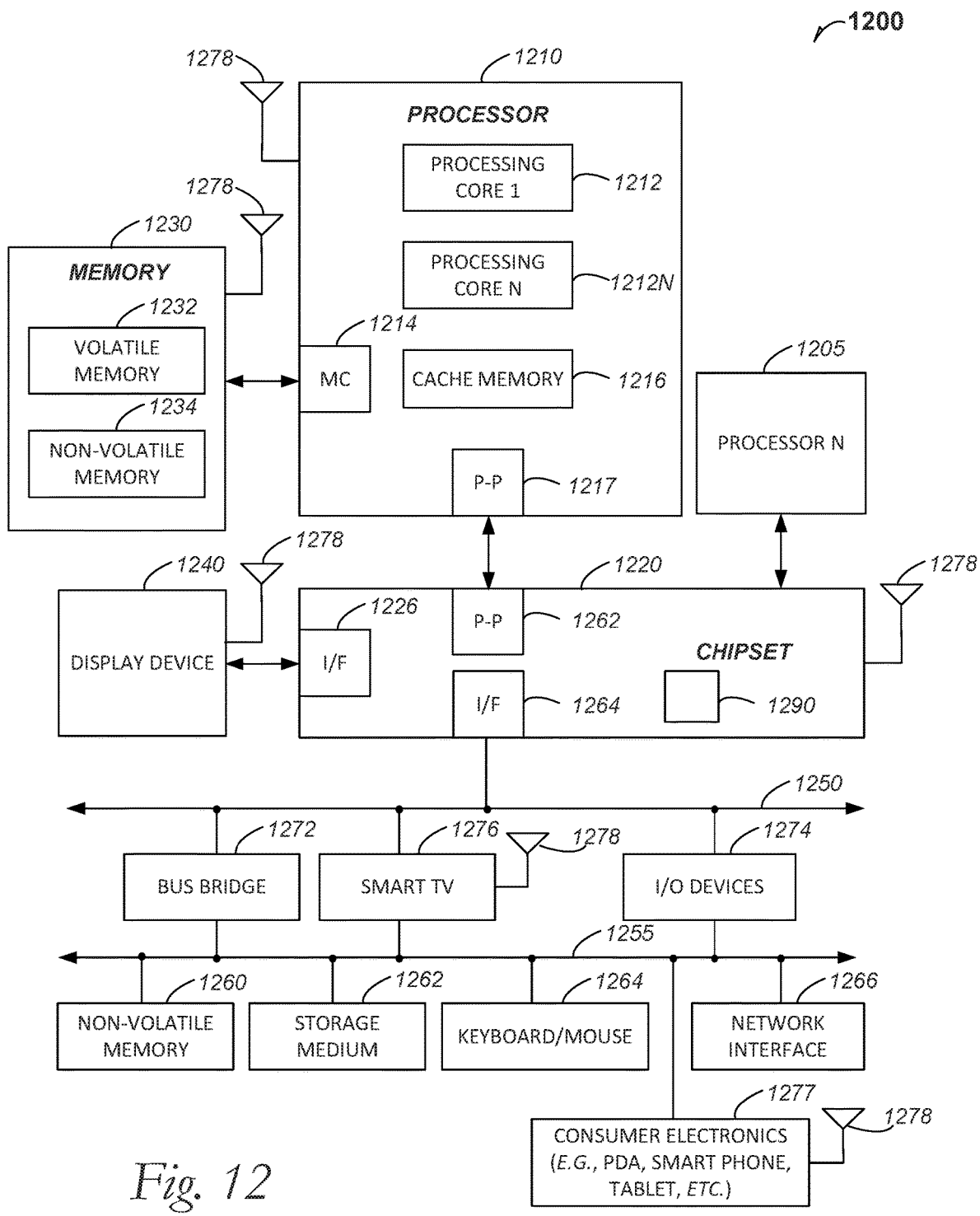
FIG. 12 is a block diagram of a computing device suitable for use with embodiments.

FIG. 12 is a computing system 1200 according to an embodiment. FIG. 12 illustrates a system level diagram, according to one embodiment of the invention. For instance, FIG. 12 depicts an example of an SiP device (e.g., the SiP device 100) including at least one landed die and at least one stacked die as described in the present disclosure.

FIG. 12 is included to show an example of a higher level device application for the present invention. In one embodiment, a system 1200 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, the SiP device system 1200 is a system on a chip (SOC) system.

In an embodiment, the package substrate described herein is both the electronic package substrate on the die side and it serves as an outer device shell. For example the package substrate 120 depicted in FIG. 2 is configured without the land-side bumps 102 and pads 104, and it is usefully insulated to allow the otherwise land side to be an outer shell of a computing device. It is now understandable that each package substrate embodiment may be either bumped or it may act as an outer shell according to non-equivalent embodiments.

In an embodiment, the processor 1210 has one or more processing cores 1212 and 1212N, where 1212N represents the Nth processor core inside processor 1210 where N is a positive integer. In an embodiment, the SiP device system 1200 includes multiple processors including 1210 and 1205, where the processor 1205 has logic similar or identical to the logic of the processor 1210. In an embodiment, the processing core 1212 includes, but is not limited to, pre-fetch logic to fetch instructions, decode logic to decode the instructions, execution logic to execute instructions and the like. In an embodiment, the processor 1210 has a cache memory 1216 to cache at least one of instructions and data for the SiP device system 1200. The cache memory 1216 may be organized into a hierarchal structure including one or more levels of cache memory.

In an embodiment, the processor 1210 includes a memory controller 1214, which is operable to perform functions that enable the processor 1210 to access and communicate with memory 1230 that includes at least one of a volatile memory 1232 and a non-volatile memory 1234. In an embodiment, the processor 1210 is coupled with memory 1230 and chipset 1220. The processor 1210 may also be coupled to a wireless antenna 1278 to communicate with any device configured to at least one of transmit and receive wireless signals. In an embodiment, the wireless antenna interface 1278 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 1232 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 1234 includes, but is not limited to, flash memory, phase change memory (PCM), read-only memory (ROM), electrically erasable programmable read-only memory (EEPROM), or any other type of non-volatile memory device.

The memory 1230 stores information and instructions to be executed by the processor 1210. In an embodiment, the memory 1230 may also store temporary variables or other intermediate information while the processor 1210 is executing instructions. In the illustrated embodiment, the chipset 1220 connects with processor 1210 via Point-to-Point (PtP or P-P) interfaces 1217 and 1262. Either of these PtP embodiments may be achieved using a semiconductive bridge as set forth in this disclosure. The chipset 1220 enables the processor 1210 to connect to other elements in the SiP device system 1200. In an embodiment, interfaces 1217 and 1222 operate in accordance with a PtP communication protocol such as the Intel® QuickPath Interconnect (QPI) or the like. In other embodiments, a different interconnect may be used.

In an embodiment, the chipset 1220 is operable to communicate with the processor 1210, 1205N, the display device 1240, and other devices 1272, 1276, 1274, 1260, 1262, 1264, 1266, 1277, etc. The chipset 1220 may also be coupled to a wireless antenna 1278 to communicate with any device configured to at least do one of transmit and receive wireless signals.

The chipset 1220 connects to the display device 1240 via the interface 1226. The display 1240 may be, for example, a liquid crystal display (LCD), a plasma display, cathode ray tube (CRT) display, or any other form of visual display device. In and embodiment, the processor 1210 and the chipset 1220 are merged into a single SOC. Additionally, the chipset 1220 connects to one or more buses 1250 and 1255 that interconnect various elements 1274, 1260, 1262, 1264, and 1266. Buses 1250 and 1255 may be interconnected together via a bus bridge 1272. In an embodiment, the chipset 1220 couples with a non-volatile memory 1260, a mass storage device(s) 1262, a keyboard/mouse 1264, and a network interface 1266, the smart TV 1276, and the consumer electronics 1277, etc. by way of at least one of the interface 1224 and 1204

In an embodiment, the mass storage device 1262 includes, but is not limited to, a solid state drive, a hard disk drive, a universal serial bus flash memory drive, or any other form of computer data storage medium. In one embodiment, network interface 1266 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 12 are depicted as separate blocks within the SiP device system 1200, the functions performed by some of these blocks may be integrated within a single semiconductor circuit or may be implemented using two or more separate integrated circuits. For example, although cache memory 1216 is depicted as a separate block within processor 1210, cache memory 1216 (or selected aspects of 1216) can be incorporated into the processor core 1212.

EXAMPLES

Example 1 is a system in package comprising: a landed first die disposed on a package substrate, wherein the landed first die includes an active surface, a die backside surface, a lateral first edge and a lateral second edge, and wherein the backside surface includes a first contoured recess that opens the die backside surface to a ledge at one of the lateral first edge and lateral second edge; a stacked first die disposed in the contoured recess and on the ledge, wherein the landed first die and the stacked first die are each contacted by a first through-silicon via (TSV).

In Example 2, the subject matter of Example 1 optionally includes a landed subsequent die disposed on the package substrate, wherein the landed subsequent die includes an active surface, a die backside surface, a lateral first edge and a lateral second edge, and wherein the die backside surface includes a subsequent contoured recess that opens the die backside surface to a ledge at one of the lateral first edge and lateral second edge; wherein the landed subsequent die and the stacked first die are each contacted by a subsequent TSV; wherein the stacked first die is configured as a communication bridge between the landed first die and the landed subsequent die.

In Example 3, the subject matter of Example 2 optionally includes wherein the landed first- and subsequent dice have different die heights that are measured from the respective active- and backside surfaces.

In Example 4, the subject matter of any one or more of Examples 2-3 optionally include wherein the first contoured recess and subsequent contoured recess form a composite contoured recess formed by respective notches formed in the landed first- and subsequent dice.

In Example 5, the subject matter of any one or more of Examples 2-4 optionally include wherein the first contoured recess and subsequent contoured recess form a composite contoured recess formed by respective notches formed in the landed first- and subsequent dice, and wherein the landed first die includes an input/output (I/O) core region through which the landed first die communicates to the stacked first die through the first TSV.

In Example 6, the subject matter of any one or more of Examples 2-5 optionally include wherein the first contoured recess and subsequent contoured recess form a composite contoured recess formed by respective notches formed in the landed first- and subsequent dice, further including a stacked subsequent die also disposed in the composite contoured recess.

In Example 7, the subject matter of Example 6 optionally includes a second-tier first die stacked upon the stacked first- and subsequent dice.

In Example 8, the subject matter of Example 7 optionally includes wherein the second-tier first die is a shielded baseband processor, and wherein at least one of the landed first- and second dice is a central processing unit.

In Example 9, the subject matter of any one or more of Examples 2-8 optionally include a landed third die and a stacked subsequent die, and wherein the landed third die includes a first- and second notch, wherein the first notch forms a composite contoured recess with the first die notch and the stacked first die is in the composite contoured recess between the landed first- and third dice, and wherein the second notch forms a composite contoured recess with the subsequent die notch, and wherein the stacked subsequent die is in the composite contoured recess between the landed third- and subsequent dice.

In Example 10, the subject matter of Example 9 optionally includes wherein at least two of the landed first- subsequent- and third dice have different die heights that are measured from the respective active- and backside surfaces.

Example 11 is a system in package device comprising: at least three landed dice disposed on a package substrate, each landed die of which includes an active surface, a die backside surface, a lateral first edge and a lateral second edge, and wherein each die backside surface includes a contoured recess that opens the die backside surface to a ledge at one of the lateral first edge and lateral second edge; a stacked first die disposed on at least one ledge of the at least three landed dice, wherein the at least one landed die and the stacked first die are each contacted by a first through-silicon via (TSV); and wherein two of the at least three landed dice include a landed first die and a landed second die.

In Example 12, the subject matter of Example 11 optionally includes wherein one of the at least three landed dice includes a landed subsequent die disposed on the package substrate, wherein the landed subsequent die and the stacked first die are each contacted by a subsequent TSV; wherein the stacked first die is configured as a communication bridge between the landed first die and the landed subsequent die; and wherein the landed first die, landed second die, and landed subsequent die are configured substantially linearly.

In Example 13, the subject matter of any one or more of Examples 11-12 optionally include wherein the three landed dice occupy a right-angle configuration.

In Example 14, the subject matter of any one or more of Examples 11-13 optionally include a fourth landed die, wherein the four landed dice are configured in a T shape.

In Example 15, the subject matter of any one or more of Examples 11-14 optionally include fourth- and a fifth landed dice, where the five landed dice are configured in a cross shape.

Example 16 is a method of forming a system in package device comprising: forming a contoured recess in a die backside surface by forming a notch that opens a portion of the die backside and a die lateral edge at the backside to a ledge; forming a through silicon via in recess; singulating the die from a semiconductive wafer; disposing the die on a package substrate to achieve a landed die; and assembling a stacked die at the ledge and connecting the landed die and the stacked die with the through silicon via.

In Example 17, the subject matter of Example 16 optionally includes wherein the landed die is a landed first die, further including: disposing a subsequent die on the package substrate to achieve a landed subsequent die, wherein the landed subsequent die includes a contoured recess; and assembling the stacked die also to the landed subsequent die.

In Example 18, the subject matter of any one or more of Examples 16-17 optionally include wherein the landed die is a landed first die, and wherein the stacked die is a first stacked die, further including: disposing a subsequent die on the package substrate to achieve a landed subsequent die, wherein the landed subsequent die includes a contoured recess; and assembling subsequent stacked die also to each of the landed first- and subsequent die.

In Example 19, the subject matter of any one or more of Examples 16-18 optionally include wherein the landed die is a landed first die, further including: disposing a subsequent die on the package substrate to achieve a landed subsequent die, wherein the landed subsequent die includes a contoured recess; assembling the stacked die also to the landed subsequent die; and assembling a second-tier die to the stacked die.

Example 20 is a system in package computing system comprising: a landed first die disposed on a package substrate, wherein the landed first die includes an active surface, a die backside surface, a lateral first edge and a lateral second edge, and wherein the backside surface includes a first contoured recess that opens the die backside surface to a ledge at one of the lateral first edge and lateral second edge; a stacked first die disposed in the contoured recess and on the ledge, wherein the landed first die and the stacked first die are each contacted by a first through-silicon via (TSV): a landed subsequent die disposed on the package substrate, wherein the landed subsequent die includes an active surface, a die backside surface, a lateral first edge and a lateral second edge, and wherein the die backside surface includes a subsequent contoured recess that opens the die backside surface to a ledge at one of the lateral first edge and lateral second edge; wherein the landed subsequent die and the stacked first die are each contacted by a subsequent TSV; and wherein the stacked first die is configured as a communication bridge between the landed first die and the landed subsequent die; a component disposed on the package substrate; and wherein the system in package device is part of a chipset that uses a processor and a memory.

In Example 21, the subject matter of Example 20 optionally includes wherein the landed first die is disposed on the package substrate on a die side, and wherein the package substrate includes is bumped in a bump array on a land side that is opposite the die side.

In Example 22, the subject matter of any one or more of Examples 20-21 optionally include wherein the landed first die is disposed on the package substrate on a die side, and wherein the package substrate includes a land side that is opposite the die side, and wherein the land side is part of an external shell for the computing system.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A system in package device comprising:
a landed first die disposed on a package substrate, wherein the landed first die includes an active surface, a die backside surface, a lateral first edge and a lateral second edge, and wherein the backside surface includes a first contoured recess that opens the die backside surface to a ledge at one of the lateral first edge and lateral second edge;
a stacked first die disposed in the contoured recess and on the ledge, wherein the landed first die and the stacked first die are each contacted by a first through-silicon via (TSV);
a landed subsequent die disposed on the package substrate, wherein the landed subsequent die includes an active surface, a die backside surface, a lateral first edge and a lateral second edge, and wherein the die backside surface includes a subsequent contoured recess that opens the die backside surface to a ledge at one of the lateral first edge and lateral second edge; and
wherein the landed subsequent die and the stacked first die are each contacted by a subsequent TSV;
wherein the stacked first die is configured as a communication bridge between the landed first die and the landed subsequent die.

2. The system in package device of claim 1,
wherein the stacked first die is configured as a communication bridge between the landed first die and the landed subsequent die.

3. The system in package device of claim 2, wherein the landed first- and subsequent dice have different die heights that are measured from the respective active- and backside surfaces.

4. The system in package device of claim 2, wherein the first contoured recess and subsequent contoured recess form a composite contoured recess formed by respective notches formed in the landed first- and subsequent dice.

5. The system in package device of claim 2, wherein the first contoured recess and subsequent contoured recess form a composite contoured recess formed by respective notches formed in the landed first- and subsequent dice, and wherein the landed first die includes an input/output (I/O) core region through which the landed first die communicates to the stacked first die through the first TSV.

6. The system in package device of claim 2, wherein the first contoured recess and subsequent contoured recess form a composite contoured recess formed by respective notches formed in the landed first- and subsequent dice, further including a stacked subsequent die also disposed in the composite contoured recess.

7. The system in package device of claim 6, further including a second-tier first die stacked upon the stacked first- and subsequent dice.

8. The system in package device of claim 7, wherein the second-tier first die is a shielded baseband processor, and wherein at least one of the landed first- and second dice is a central processing unit.

9. A system in package device comprising:
a landed first die disposed on a package substrate, wherein the landed first die includes an active surface, a die backside surface, a lateral first edge and a lateral second edge, and wherein the backside surface includes a first contoured recess that opens the die backside surface to a ledge at one of the lateral first edge and lateral second edge;

a stacked first die disposed in the contoured recess and on the ledge, wherein the landed first die and the stacked first die are each contacted by a first through-silicon via (TSV);

a landed subsequent die disposed on the package substrate, wherein the landed subsequent die includes an active surface, a die backside surface, a lateral first edge and a lateral second edge, and wherein the die backside surface includes a subsequent contoured recess that opens the die backside surface to a ledge at one of the lateral first edge and lateral second edge; and wherein the landed subsequent die and the stacked first die are each contacted by a subsequent TSV;

wherein the stacked first die is configured as a communication bridge between the landed first die and the landed subsequent die;

wherein the stacked first die is configured as a communication bridge between the landed first die and the landed subsequent die: and a landed third die and a stacked subsequent die, and wherein the landed third die includes a first- and second notch, wherein the first notch forms a composite contoured recess with the first die notch and the stacked first die is in the composite contoured recess between the landed first- and third dice, and wherein the second notch forms a composite contoured recess with the subsequent die notch, and wherein the stacked subsequent die is in the composite contoured recess between the landed third- and subsequent dice.

10. The system in package device of claim 9, wherein at least two of the landed first- subsequent- and third dice have different die heights that are measured from the respective active- and backside surfaces.

11. A system in package device comprising:
at least three landed dice disposed on a package substrate, each landed die of which includes an active surface, a die backside surface, a lateral first edge and a lateral second edge, and wherein each die backside surface includes a contoured recess that opens the die backside surface to a ledge at one of the lateral first edge and lateral second edge;
a stacked first die disposed on at least one ledge of the at least three landed dice, wherein the at least one landed die and the stacked first die are each contacted by a first through-silicon via (TSV); and
wherein two of the at least three landed dice include a landed first die and a landed second die.

12. The system in package of claim 11, wherein one of the at least three landed dice includes a landed subsequent die disposed on the package substrate, wherein the landed subsequent die and the stacked first die are each contacted by a subsequent TSV;
wherein the stacked first die is configured as a communication bridge between the landed first die and the landed subsequent die; and
wherein the landed first die, landed second die, and landed subsequent die are configured substantially linearly.

13. The system in package of claim 11, wherein the three landed dice occupy a right-angle configuration.

14. The system in package of claim 11, further including a fourth landed die, wherein the four landed dice are configured in a T shape.

15. The system in package of claim 11, further including fourth- and a fifth landed dice, where the five landed dice are configured in a cross shape.

16. A system in package computing system comprising:
a landed first die disposed on a package substrate, wherein the landed first die includes an active surface, a die backside surface, a lateral first edge and a lateral second edge, and wherein the backside surface includes a first contoured recess that opens the die backside surface to a ledge at one of the lateral first edge and lateral second edge;
a stacked first die disposed in the contoured recess and on the ledge, wherein the landed first die and the stacked first die are each contacted by a first through-silicon via (TSV):
a landed subsequent die disposed on the package substrate, wherein the landed subsequent die includes an active surface, a die backside surface, a lateral first edge and a lateral second edge, and wherein the die backside surface includes a subsequent contoured recess that opens the die backside surface to a ledge at one of the lateral first edge and lateral second edge;
wherein the landed subsequent die and the stacked first die are each contacted by a subsequent TSV; and
wherein the stacked first die is configured as a communication bridge between the landed first die and the landed subsequent die;
a component disposed on the package substrate; and
wherein the system in package device is part of a chipset that uses a processor and a memory.

17. The computing system of claim 16, wherein the landed first die is disposed on the package substrate on a die side, and wherein the package substrate includes is bumped in a bump array on a land side that is opposite the die side.

18. The computing system of claim 16, wherein the landed first die is disposed on the package substrate on a die side, and wherein the package substrate includes a land side that is opposite the die side, and wherein the land side is part of an external shell for the computing system.

* * * * *